United States Patent
Moell et al.

(10) Patent No.: US 9,164,140 B2
(45) Date of Patent: Oct. 20, 2015

(54) METHOD FOR INSULATION FAULT MONITORING WITH DYNAMIC RESPONSE CHARACTERISTIC

(71) Applicants: Winfried Moell, Laubach (DE); Karl Schepp, Reiskirchen (DE); Carsten Wiess, Laubach-Lauter (DE)

(72) Inventors: Winfried Moell, Laubach (DE); Karl Schepp, Reiskirchen (DE); Carsten Wiess, Laubach-Lauter (DE)

(73) Assignee: BENDER GMBH & CO. KG, Gruenberg (DE)

( * ) Notice: Subject to any disclaimer, the term of this patent is extended or adjusted under 35 U.S.C. 154(b) by 385 days.

(21) Appl. No.: 13/627,073

(22) Filed: Sep. 26, 2012

(65) Prior Publication Data
US 2013/0082714 A1  Apr. 4, 2013

(30) Foreign Application Priority Data
Sep. 29, 2011 (DE) .......... 10 2011 083 790

(51) Int. Cl.
| G01R 31/28 | (2006.01) |
| H01H 31/12 | (2006.01) |
| G01R 31/02 | (2006.01) |
| G01R 31/12 | (2006.01) |

(52) U.S. Cl.
CPC .............. *G01R 31/025* (2013.01); *G01R 31/12* (2013.01)

(58) Field of Classification Search
CPC ............................. G01R 31/025; G01R 31/12
USPC .......................................... 324/509, 525, 551
See application file for complete search history.

(56) References Cited

U.S. PATENT DOCUMENTS

| 2003/0234653 A1* | 12/2003 | Kollenda et al. ............. 324/551 |
| 2010/0114392 A1 | 5/2010 | Lancaster |
| 2011/0163759 A1* | 7/2011 | Ishii et al. .................... 324/551 |

FOREIGN PATENT DOCUMENTS

DE  102007008097 A1  10/2007

* cited by examiner

*Primary Examiner* — Jermele M Hollington
*Assistant Examiner* — Farhana Hoque
(74) *Attorney, Agent, or Firm* — Quarles & Brady LLP

(57) ABSTRACT

A method and device for insulation fault monitoring in ungrounded electrical networks. The method includes the following steps: measuring an insulation resistance, determining a responding value for the insulation resistance, and triggering a warning signal if the measured insulation resistance falls below the responding value, wherein the responding value is determined dynamically as a momentary responding value in a warning value establishment process downstream of the insulation resistance measurement.

13 Claims, 1 Drawing Sheet

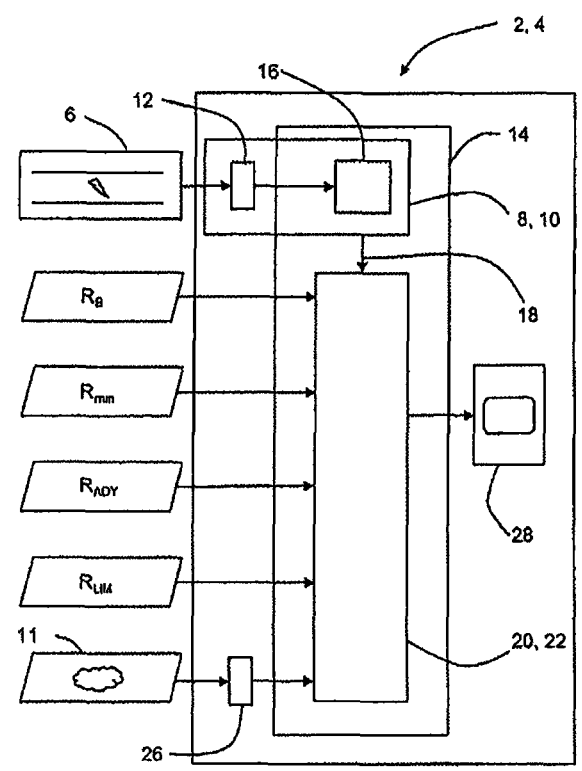

METHOD FOR INSULATION FAULT MONITORING WITH DYNAMIC RESPONSE CHARACTERISTIC

CROSS REFERENCE TO RELATED APPLICATION

The present application claims the benefit of German Patent Application No. 10 2011 083 790.6 filed Sep. 29, 2011, which is fully incorporated herein by reference.

STATEMENT REGARDING FEDERALLY SPONSORED RESEARCH OR DEVELOPMENT

Not applicable.

FIELD OF THE INVENTION

The invention relates to a method for insulation fault monitoring in ungrounded electrical networks, said method comprising the following steps: measuring an insulation resistance, determining a responding value for the insulation resistance, and triggering a warning signal if the measured insulation resistance falls below the responding value.

The invention further relates to a device for insulation fault monitoring in ungrounded electrical networks, said device comprising means for measuring an insulation resistance and a processor unit for determining a responding value for the insulation resistance as well as a warning device for triggering a warning signal.

In view of the operational reliability and availability of a power supply, ungrounded electricity supply networks (IT systems) have been widely established as a network configuration. In ungrounded electricity supply networks, an active conductor is not connected directly to ground potential, and therefore, due to the absence of a return, no short-circuit current can flow in the event of a (single-pole) ground fault, which would blow a fuse and lead to an interruption in operation. An ungrounded network can continue to be operated safely in spite of this ground fault (first insulation fault). This network configuration is widespread, in particular in photovoltaic plants (PV plants), since in this case the main focus is on an energy supply that is uninterrupted to the greatest possible extent.

Fully insulated, ungrounded electricity supply systems offer the best possible protection for people should they contact a live conductor, since a closed circuit with a current flowing via the (grounded) person cannot be produced due to the ideally infinite impedance value between the conductor and ground. The insulation resistance is therefore of particular importance in ensuring sufficient personal and plant protection. A fall in the insulation resistance below a predefined value reduces the protection against direct and indirect contact of the electrical plant; furthermore, fault currents may occur and may lead to faulty functioning of electrical devices or to an interruption in operation, thus resulting in high costs.

In the field of electrical plants, a constant monitoring of the insulation resistance is therefore necessary so as to emit a warning signal in the event that the insulation resistance falls below a safety-critical responding value and, if necessary, so as to shut down the plant.

Insulation resistances can change as a result of aging processes and environmental influences, such as temperature, moisture, pollution or damage, and also as a result of chemical or physical processes. In PV plants in particular, the insulation resistance is highly dependent on the ambient conditions of the plant. In large-scale plants the insulation resistance may thus fluctuate in a range of 1000 ohm/volt to a few ohm/volt. This may result in false trips if the insulation resistance falls below the responding value as a result of ambient causes. In order to avoid false trips of this type, the responding value in insulation monitoring systems is set to a value well below a minimal insulation resistance value in accordance with the prior art. The fact that a risk to people may still be posed above this setting of an (excessively) low responding value is disadvantageous in this instance.

In particular in PV plants, the insulation resistance changes very dramatically due to the ambient conditions, even without the occurrence of a fault. If an insulation fault occurs in a "high-ohm phase", for example during night-time hours in the case of photovoltaic plants, a decrease in the currently measured insulation resistance, which deviates considerably from the expected progression, thus occurs, and this insulation fault can therefore only be identified when it also falls below the fixedly set, low responding value.

Approaches are known from the prior art for taking into account, by statistical averaging, the change in the insulation resistance due to the ambient conditions. A disadvantage of this indirect incorporation of the ambient conditions is the long measurement times of the insulation monitoring device, however.

SUMMARY OF THE INVENTION

The object of the present invention is therefore to ensure the most reliable possible personal and plant protection as well as a high level of operational reliability during insulation monitoring of an ungrounded power supply system, whilst avoiding false trips. This object is achieved in an embodiment of the invention by measuring an insulation resistance, determining a responding value for the insulation resistance, and triggering a warning signal if the measured insulation resistance falls below the responding value, wherein the responding value is determined dynamically as a momentary responding value in a warning value establishment process downstream of the insulation resistance measurement.

During insulation fault monitoring, the currently measured insulation resistance is thus compared in accordance with the invention with a dynamically changing momentary responding value in the form of a comparison value. This responding value is determined in a warning value establishment process downstream of the insulation resistance measurement, and allows automatic adaptation of the responding value to the environmental conditions prevailing at the time of the measurement. The measured insulation resistance during night-time hours thus normally lies at a higher level than during the day. The responding value also follows this trend in accordance with the invention, and therefore a fault (that is to say a noticeable fall in the current, measured insulation resistance) is identified with greater reliability because the insulation resistance falls earlier below the dynamically upwardly adapted responding value. During the day (that is to say with a relatively low level of the insulation resistance), false trips are by contrast avoided due to a likewise lower responding value. The avoidance of false trips leads to increased operational reliability and therefore to increased reliability of supply of the electrical plant. At the same time, plant protection and, in particular, personal protection are improved due to the dynamically adapted responding value, because faults are identified early on.

In an advantageous embodiment of the invention, the momentary responding value is determined in the warning value establishment process as a function of a base value, of setting parameters, of ambient data, and of an insulation resistance value averaged over time. Starting from a plant-specific insulation resistance as a base value, the momentary responding value is given by the modification of this base value in accordance with the ambient data. For example, an adaptation is thus made according to the time, temperature and atmospheric moisture, since, based on experience, dew in the early-morning hours has an effect on the insulation resistance. As a result of the direct incorporation of the ambient data, short measurement times and, as a result, increased personal protection are thus achieved.

Setting parameters and an insulation resistance value averaged over time are further incorporated in the determination of the momentary responding value so as to map the operating conditions of the plant onto a realistic responding value, which leads to the most reliable possible fault identification. Limit values for the responding value are thus fixed and a change in said responding value with respect to a temporal average of the insulation resistance is taken into account.

The base value is expediently a specific, fixed value of the insulation resistance for the network to be monitored. An insulation resistance value typical for the electrical plant, which is given by a calculation defined by a formula, is thus used as a starting point for the calculation of the momentary responding value.

In a specific embodiment, the following are used as setting parameters: a minimum responding value $R_{min}$ as a lower response limit value, an auxiliary value in the form of a responding value dynamic $R_{ADY}$ for defining a dynamic range in which the momentary responding value may change dynamically, and an auxiliary value in the form of responding value limits $R_{LIM}$ for determining a difference of the momentary responding value from the insulation resistance value averaged over time.

The momentary responding value is preferably determined starting from the base value $R_B$ by a correction according to the ambient data, wherein the momentary responding value adopts the minimum responding value $R_{min}$ at its minimum and the value in the form of a responding value dynamic $R_{ADY}$ at its maximum and, within this dynamic range, lies below the insulation resistance value averaged over time, at least by the difference of the responding value limits $R_{LIM}$.

The setting parameters define the range in which the momentary responding value may vary and determine how the momentary responding value is to be adapted to the operating situation of the electrical plant so as to ensure reliable fault identification. responding value determined dynamically in such a way advantageously makes it possible to identify, in real time, a "true" fall in the insulation resistance.

It has proven to be expedient if the following influencing variables are incorporated as ambient data, either individually or in any combination, into the warning value establishment process: time, light intensity, temperature, atmospheric moisture, dew, salt content of the air, speed of change of the insulation resistance, number of people present in the region of the electrical plant, and additionally, with use of the method in photovoltaic plants: electrical conductivity of the module glass surface, supplied voltage of the photovoltaic modules, electrical output of the photovoltaic modules. In addition, further physical variables and environmental data can also be taken into account via suitable interfaces so as to determine a momentary responding value adapted more precisely to the respective prevailing operating situation. Even critical changes to the insulation resistance are thus identified at any moment in a large number of operating situations.

In a further embodiment, a visually and/or acoustically perceptible signal of the monitoring state is generated according to the momentary responding value and informs whether plant or personal protection is ensured. The operator of the electrical plant is thus notified of the extent to which the relatively high demands on personal protection compared to pure plant protection are currently met.

In particularly stable ambient and operating conditions, the dynamic determination of the momentary responding value can be deactivated and a return to a mode with a fixed responding value can be implemented.

With regard to a device for insulation fault monitoring in ungrounded electrical networks, the object of the invention is also achieved in a device, in which to determine the responding value, a processor unit has a warning value establishment unit downstream of the insulation resistance measurement to dynamically determine a momentary responding value.

In accordance with the invention, the processor unit comprises a warning value establishment unit, in which the input signals are processed on a digital level. Based on the input variables, which include the ambient data in addition to the currently measured insulation resistance and the setting parameters, the momentary responding value is determined dynamically by the method according to the invention and a warning signal is generated by comparison with the current insulation resistance value in the event of a fault.

BRIEF DESCRIPTION OF THE DRAWINGS

Further advantageous design features will emerge from the following description and the drawing, which explains a preferred embodiment of the invention and in which:

FIG. 1 shows a functional block diagram of the method and of the device for insulation fault monitoring.

DETAILED DESCRIPTION OF THE EXAMPLE EMBODIMENTS

The diagram illustrated in FIG. 1 describes the essential functional blocks of the device 4 according to the invention in addition to the essential processing steps of the method 2 according to the invention.

The method initially comprises an insulation resistance measurement 8 in an ungrounded power supply network 6. The power supply network 6 may be a photovoltaic plant for example, in which the focus is on efficient utilisation and high availability, and in which a monitoring of the insulation resistance therefore appears to be a necessary electrical protective measure. The device 4 has means 10 for measuring an insulation resistance, wherein these means 10 are connected via a coupling and measuring circuit 12 to the power supply network 6 and, as a component of a processor unit 14, comprise an evaluating circuit 16.

The insulation resistance measurement 8 or the means 10 for measuring the insulation resistance supply a current value 18 of the insulation resistance as an output signal and forward this on to a warning value establishment process 20, which is carried out in a warning value establishment unit 22.

The momentary responding value is calculated in the warning value establishment process 20 or the warning value establishment unit 22. For dynamic establishment in accordance with the invention of the momentary responding value, a base value $R_B$, and as setting parameters a minimum responding value $R_{min}$ as a lower response limit value, an auxiliary value in the form of a responding value dynamic $R_{ADY}$ for defining a dynamic range in which the momentary responding value may change dynamically, and an auxiliary value in the form of responding value limits $R_{LIM}$ for determining a difference of the momentary responding value from an insulation resistance value averaged over time are used.

Furthermore, ambient data 24 are also incorporated into the dynamic determination. The ambient data describe the dependence of the insulation resistance on the operating state of the electrical plant, which is in turn determined decisively by external environmental influences (for example temperature, atmospheric moisture), physical variables of the plant (for example generated power, open-circuit voltage) and further non-physical parameters (for example people present in the region of the plant). The device 4 has an interface device 26 to detect the ambient data.

The momentary responding value is then determined starting from the base value $R_B$ by a correction according to the ambient data, wherein the momentary responding value adopts the minimum responding value $R_{min}$ at its minimum and the value in the form of a responding value dynamic $R_{ADY}$ at its maximum and, within this dynamic range, lies below the insulation resistance value averaged over time, at least by the difference of the responding value limits $R_{LIM}$.

The determination of the momentary responding value will be explained hereinafter with reference to the example of a photovoltaic plant. If the insulation resistance averaged over time in a fault-free photovoltaic plant lies at 10 kohm/200 kohm/80 kohm during the day with low atmospheric moisture/overnight/in the early morning hours with dew and the values $R_{min}$=3 kohm, $R_{ADY}$=100 kohm and $R_{LIM}$=20 kohm are adopted as setting parameters, faults above 3 kohm and up to a maximum of 100 kohm are also identified with activated dynamics. By contrast, with a fixed responding value of 3 kohm, faults will only be detected if the current value of the insulation resistance falls below 3 kohm.

A fault, that is to say a drop in the current insulation resistance value below the dynamically determined responding value, would thus be indicated in the above example during the day/at night/in the early morning hours at 3 kohm/100 kohm/60 kohm (60 kohm=80 kohm−$R_{LIM}$).

Should the measured insulation resistance fall below the responding value in the event of a fault, a warning signal is thus triggered in the warning device 28 and is signalled visually and/or acoustically to the user.

The invention claimed is:

1. A method for insulation fault monitoring in ungrounded electrical networks, said method comprising:
   measuring an insulation resistance;
   determining a responding value for the insulation resistance, wherein the responding value is calculated dynamically as a momentary responding value in a warning value establishment process downstream of the insulation resistance measurement, the momentary responding value being determined in the warning value establishment process as a function of a base value, of setting parameters, of ambient data, and of an insulation resistance value averaged over time;
   comparing the insulation resistance to the responding value to determine whether the measured insulation resistance falls below the responding value; and
   triggering a warning signal if the measured insulation resistance falls below the responding value.

2. The method according to claim 1, in which the base value is a specific, fixed value of the insulation resistance for the network to be monitored.

3. The method according to claim 1, in which the following parameters are used as setting parameters: a minimum responding value as a lower response limit value, an auxiliary value in the form of a responding value dynamic for defining a dynamic range in which the momentary responding value may change dynamically, and an auxiliary value in the form of responding value limits for determining a difference of the momentary responding value from the insulation resistance value averaged over time.

4. The method according to claim 1, in which the momentary responding value is determined starting from the base value by a correction according to the ambient data, wherein the momentary responding value adopts the minimum responding value at its minimum and the value in the form of a responding value dynamic at its maximum and, within this dynamic range, lies below the insulation resistance value averaged over time, at least by the difference of the responding value limits.

5. The method according to claim 1, in which at least one of the following influencing variables are incorporated as ambient data into the warning value establishment process: time, light intensity, temperature, atmospheric moisture, dew, salt content of the air, speed of change of the insulation resistance, number of people present in the region of the electrical plant, and additionally, with use of the method in photovoltaic plants: electrical conductivity of the module glass surface, supplied voltage of the photovoltaic modules, electrical output of the photovoltaic modules.

6. The method according to claim 1, in which at least one of a visually perceptible signal and/or a acoustically perceptible signal of the monitoring state is generated according to the momentary responding value and informs whether plant or personal protection is ensured.

7. The method according to claim 1, in which the dynamic determination of the momentary responding value can he deactivated.

8. A device for insulation fault monitoring in ungrounded electrical networks, said device comprising:
   a circuit measuring an insulation resistance;
   a processor unit calculating a responding value for the insulation resistance,
   wherein to calculate the responding value, the processor unit dynamically calculates the responding value as a momentary responding value, the momentary responding value being calculated in a warning value establishment process as a function of a base value, of setting parameters, of ambient data, and of an insulation resistance value averaged over time, the processor unit then compares the responding value to the insulation resistance to determine whether the insulation resistance is less than the momentary responding value; and
   a warning device triggering a warning signal if the insulation resistance is less than the momentary responding value.

9. The device according to claim 8, including an interface device detecting ambient data.

10. The device according to claim 8, in which the base value is a specific, fixed value of the insulation resistance for the network to be monitored.

11. The device according to claim 8, in which the following parameters are used as setting parameters: a minimum responding value as a lower response limit value, an auxiliary value in the form of a responding value dynamic for defining a dynamic range in which the momentary responding value may change dynamically, and an auxiliary value in the form of responding value limits for determining a difference of the momentary responding value from the insulation resistance value averaged over time.

12. The device according to claim 8, in which the momentary responding value is calculated starting from the base value by a correction according to the ambient data, wherein the momentary responding value adopts the minimum responding value at its minimum and the value in the form of a responding value dynamic at its maximum and, within this dynamic range, lies below the insulation resistance value averaged over time, at least by the difference of the responding value limits.

13. The device according to claim 8, in which at least one of the following influencing variables are incorporated as ambient data into the warning value establishment process: time, light intensity, temperature, atmospheric moisture, dew, salt content of the air, speed of change of the insulation resistance, number of people present in the region of the electrical plant.

* * * * *

UNITED STATES PATENT AND TRADEMARK OFFICE
CERTIFICATE OF CORRECTION

| | | |
|---|---|---|
| PATENT NO. | : 9,164,140 B2 | Page 1 of 1 |
| APPLICATION NO. | : 13/627073 | |
| DATED | : October 20, 2015 | |
| INVENTOR(S) | : Moell et al. | |

It is certified that error appears in the above-identified patent and that said Letters Patent is hereby corrected as shown below:

In The Claims

Column 6, line 29
"he" should be --be--

Signed and Sealed this
Twenty-ninth Day of March, 2016

Michelle K. Lee
*Director of the United States Patent and Trademark Office*